(12) United States Patent
Ludwig et al.

(10) Patent No.: US 7,084,630 B2
(45) Date of Patent: Aug. 1, 2006

(54) MULTI-MODAL RF COIL FOR MAGNETIC RESONANCE IMAGING

(75) Inventors: Reinhold Ludwig, Paxton, MA (US); Gene Bogdanov, Manchester, CT (US); Aghogho Obi, Worcester, MA (US)

(73) Assignee: Worcester Polytechnic Institute, Worcester, MA (US)

( * ) Notice: Subject to any disclaimer, the term of this patent is extended or adjusted under 35 U.S.C. 154(b) by 64 days.

(21) Appl. No.: 10/789,756

(22) Filed: Feb. 27, 2004

(65) Prior Publication Data
US 2005/0162168 A1 Jul. 28, 2005

Related U.S. Application Data

(63) Continuation-in-part of application No. 10/766,049, filed on Jan. 28, 2004, now abandoned.

(51) Int. Cl.
*G01V 3/00* (2006.01)
(52) U.S. Cl. .................. 324/318; 324/309; 324/313
(58) Field of Classification Search ................ None
See application file for complete search history.

(56) References Cited

U.S. PATENT DOCUMENTS

| | | | | |
|---|---|---|---|---|
| 4,620,155 A * | 10/1986 | Edelstein | ................ | 324/318 |
| 5,315,251 A * | 5/1994 | Derby | ................ | 324/318 |
| 5,363,845 A | 11/1994 | Chowdhury et al. | ...... | 128/653.5 |
| 5,379,767 A | 1/1995 | Derby et al. | ............ | 128/653.5 |
| 5,422,578 A * | 6/1995 | Hoegler | ................ | 324/318 |
| 5,445,153 A * | 8/1995 | Sugie et al. | ............. | 600/422 |
| 5,515,855 A | 5/1996 | Meyer et al. | ............ | 128/653.5 |
| 5,565,780 A * | 10/1996 | Derby | ................ | 324/318 |
| 5,578,925 A * | 11/1996 | Molyneaux et al. | ......... | 324/318 |
| 5,602,479 A | 2/1997 | Srinivasan et al. | ......... | 324/318 |
| 5,602,557 A | 2/1997 | Duerr | ................ | 343/742 |
| 5,646,530 A | 7/1997 | Strenk et al. | ............. | 324/318 |
| 5,680,047 A * | 10/1997 | Srinivasan et al. | ......... | 324/318 |
| 5,699,802 A | 12/1997 | Duerr | ................ | 128/653.5 |
| 5,804,969 A * | 9/1998 | Lian et al. | ............. | 324/318 |
| 5,933,007 A * | 8/1999 | Schommer et al. | ......... | 324/318 |
| 6,023,166 A | 2/2000 | Eydelman | ................ | 324/318 |
| 6,163,717 A | 12/2000 | Su | ................ | 600/422 |
| 6,198,962 B1 | 3/2001 | Su | ................ | 600/422 |

(Continued)

FOREIGN PATENT DOCUMENTS

| | | |
|---|---|---|
| EP | 0290187 | 11/1988 |
| JP | 10211185 | 8/1998 |
| WO | WO 02/32306 | 4/2002 |

*Primary Examiner*—Diego Gutierrez
*Assistant Examiner*—Tiffany A. Fetzner
(74) *Attorney, Agent, or Firm*—Burns & Levinson LLP; Jacob N. Erlich; John A. Hamilton

(57) ABSTRACT

Multi-modal coils for coupling MRI RF signals from an anatomical region(s) to be imaged. The coil includes a segmented annular base ring conductor including a plurality of capacitances disposed between the segments, and at least one arcuate conductor symmetrically connected at each end to the base ring, one end terminating in direct contact with the base ring, the other end electrically connected to the base ring via two of the capacitive electrical connections. The RF coil is operable in multiple receiving modes in phase quadrature to establish a rotating magnetic field phasor orthogonal to the temporally constant uniform magnetic field of the magnetic resonance instrument. The RF coil can be combined with a second RF coil to simultaneously image two anatomical regions.

18 Claims, 8 Drawing Sheets

U.S. PATENT DOCUMENTS

| | | | |
|---|---|---|---|
| 6,275,723 B1 | 8/2001 | Ferris et al. | 600/417 |
| 6,326,789 B1 * | 12/2001 | Yoshida et al. | 324/318 |
| 6,348,794 B1 * | 2/2002 | Nabetani et al. | 324/318 |
| 6,493,572 B1 | 12/2002 | Su et al. | 600/422 |
| 6,577,888 B1 | 6/2003 | Chan et al. | 600/422 |
| 2005/0162168 A1 * | 7/2005 | Ludwig et al. | 324/322 |

* cited by examiner

LOCALIZED DUAL-LOOP RF COIL FOR BREAST CANCER IMAGING

Figure 4A MODE 0

Figure 4B MODE 1

MULTI-MODAL RF COIL FOR MAGNETIC RESONANCE IMAGING

CROSS REFERENCE TO RELATED APPLICATIONS

This application is a continuation-in-part of U.S. patent application Ser. No. 10/766,049 entitled "Multi-Modal RF Coil For Magnetic Resonance Imaging", filed Jan. 28, 2004 now abandoned, said application being incorporated herein by reference.

FIELD OF THE INVENTION

This invention relates generally to magnetic resonance imaging RF coils, and, more particularly, to the imaging of an anatomical region of interest, such as the human female breast, for the purpose of early detection of cancerous growths and lesions.

BACKGROUND OF THE INVENTION

In the US alone, breast cancer is the second leading cause of female cancer mortality. Each year breast cancer strikes more than 200,000 US women and results in the deaths of approximately 40,000. Early detection is the key to saving lives and reducing the cost of treating breast cancer. The American Cancer Society reports that 96% of all women survive breast cancer when it is detected in its early stages; however, one in four is unlikely to survive with late detection (1). The average cost of treating early breast cancer today is estimated to be between $10,000 and $15,000, while late stage treatments average more than $100,000. Magnetic resonance imaging (MRI) is a widely used clinical soft-tissue diagnosis tool that has enjoyed significant success. However, commercially available whole-body imaging systems with large encircling coils are less efficient when the goal is to obtain detailed, high-resolution images from a localized area such as the female breast. Researchers have recognized these limitations and have developed a number of specialized designs, mostly related to breast-encircling coils, such as illustrated generically in FIG. 1. A good example of the present state-of-the-art in RF coil development is encapsulated in the U.S. Pat. No. 6,023,166 (Feb. 8, 2000) issued to Greg Eydelman of Fonar Corporation. Eydelman built a system consisting of a primary RF coil encircling the entire human chest and two secondary (two winding) RF coils fitted over each breast.

Additional single loop (U.S. Pat. No. 5,646,530, Diagnostic Instruments, Jul. 8, 1997) or array coil (U.S. Pat. No. 6,493,572, Toshiba, Dec. 10, 2002) configurations have been proposed. Particularly the array coil concept attempts to capitalize on the use of multiple receiver channels to improve signal-to-noise ratio. Unfortunately, these multi-loop coil configurations are less efficient due to their fixed wire arrangement; they typically cover only a small region of interest (ROI) in the center of the breast and leave critical areas near the breast bone insufficiently covered.

There exists, therefore, a need to provide an anatomically shaped coil that covers the entire extent of a ROI, such as a breast volume, which is better suited to detect the early onset of cancer, for instance by being more sensitive to the increased water content associated with malignancy. A high signal-to-noise ratio (SNR) RF coil may provide sufficient sensitivity to yield a detectable response in localized increases in blood volume present during angiogenic activity observed in early tumor growth.

SUMMARY OF THE INVENTION

The needs for the invention set forth above as well as further and other needs and advantages of the present invention are achieved by the embodiments of the invention described hereinbelow.

The present invention is directed to a single or dual set of multi-modal radio frequency (RF) coils for use in a magnetic resonance (MR) imaging system. Each RF coil is dimensioned so as to receive an anatomical region of interest to be imaged, such as a human breast. Each RF coil functions in at least two modes operated in phase quadrature. In a RF quadrature detection configuration, pairs of MR signals are processed and combined to obtain one combined MR signal having a better signal-to-noise ratio than either of the single signals from the individual RF coil channels of the configuration.

In one embodiment, the RF coil is comprised of a segmented annular base ring conductor, a plurality of capacitive electrical connections (e.g., fixed and/or tunable capacitors) disposed between the segments of the base ring, and at least one arcuate conducting strap having one end in direct electrical contact with the base ring and another end electrically connected to the base ring through two of the capacitive electrical connections (e.g., one or more fixed and/or tunable capacitors.) The ends of each strap terminate at spatially distinct positions along the base ring, symmetrically disposed with respect to an imaginary central axis of the base ring. Some of the capacitances employed may serve to tune the RF coil to a desired resonance frequency and/or match the coil's impedance to one or more transmission lines for interfacing the coil with the single- or multi-channel receiver electronics of the MR instrument with which the RF coil is utilized.

The term "arcuate" as used herein, encompasses a variety of geometrical shapes having appropriate dimensions to receive the anatomical region of interest. Any suitable conductor may be used in forming segments of the base ring and strap, but preferably microstrip lines are employed.

In alternative embodiments described below, a single strap or multiple straps are operated in multiple receiving (or transmitting) modes in order to establish a rotating magnetic field phasor orthogonal to the main magnetic field created by the MR instrument in which the RF coil is utilized.

In a single-strap embodiment of the RF coil, a first of two modes is established by current flowing circularly through the annular base ring, and a second mode is established by a 90° phase shifted current flowing through the strap and evenly branching between two halves of the annular base ring. Each strap is preferably composed of multiple conductor segments electrically connected to one another by capacitive electrical connections (e.g., one or more fixed and/or tunable capacitors) whose reactances compensate the coil's inherent inductive reactance at a resonant frequency. These capacitances also serve to reduce eddy currents induced in the conductors by the switching gradient field.

As described below, electrical ports of the RF coil may be configured to interface with a plurality of standard transmission lines (i.e., coaxial cables) for conveying signals to a single or multi-channel receiver amplifier of the MR instrument, or may be adapted with hybridizing components to reduce the number of transmission lines required to achieve the interface.

In another embodiment of the present invention, two multi-modal RF coils are disposed with their respective segmented annular base rings so as to enable simultaneous imaging of two anatomical regions, such as two breasts of a patient.

BRIEF DESCRIPTION OF THE FIGURES OF THE DRAWING

For a better understanding of the present invention, together with other and further objects thereof, reference is made to the accompanying drawing and detailed description, wherein:

FIGS. 4A, 4B are illustrations of single-strap embodiments of the RF cup-coil indicating two modes (Mode$_0$, Mode$_1$) of operation possible for magnetic resonance imaging;

DETAILED DESCRIPTION OF PREFERRED EMBODIMENTS OF THE INVENTION

Figure 1:
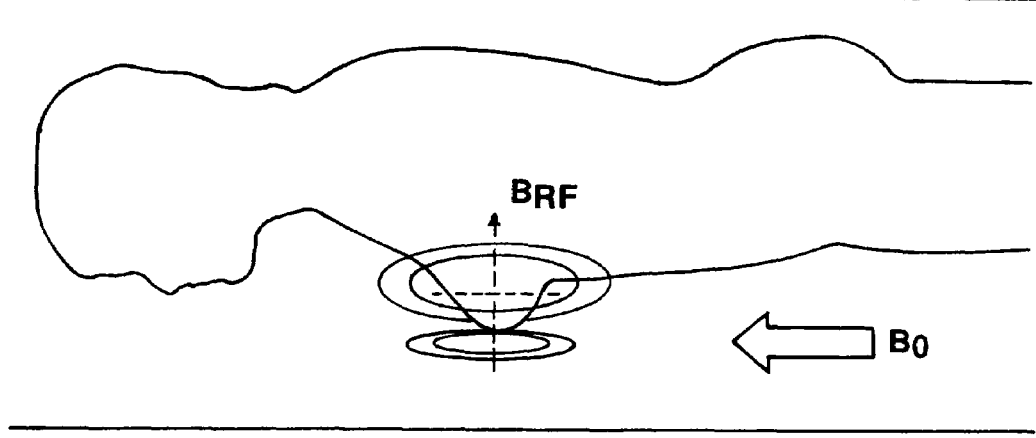
FIG. 1 is an illustration of a prior art RF coil configured for pendant use in magnetic resonance imaging of a human breast.
Figure 2:
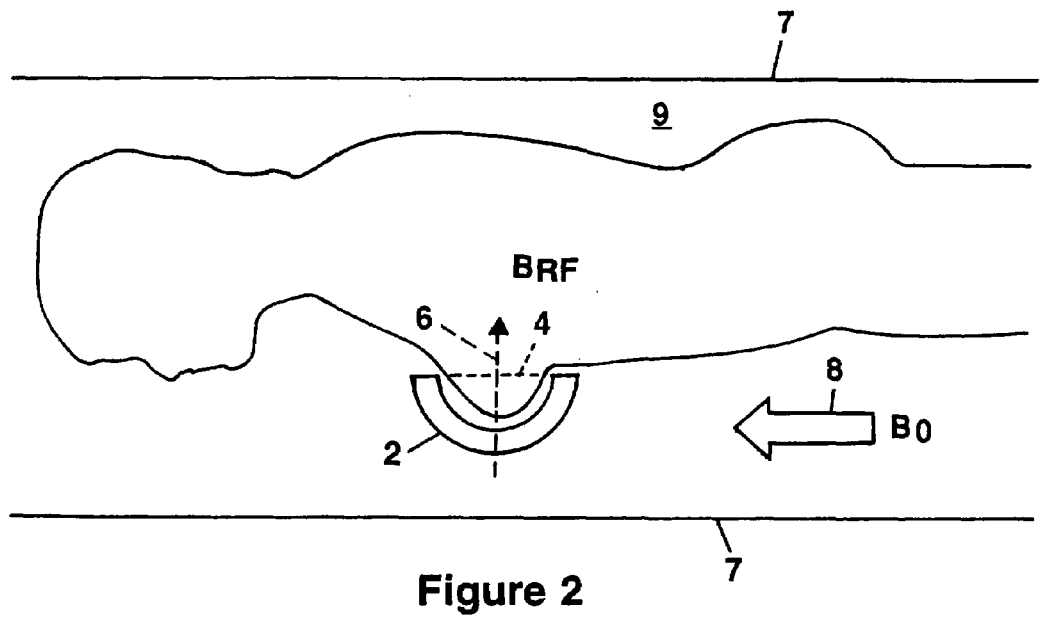
FIG. 2 is a side view illustration of a generic cup-shaped RF coil positioned proximate a female breast.

With reference to FIG. 2, the present invention is directed to a single or dual set of radio frequency (RF) cup-coils 2 configured to receive an anatomical region of interest, such as human breast(s) 4, and to function in at least two receiving modes operated in quadrature configurations. The cup-coil 2 is illustrated in an pendant configuration within the bore 9 of a conventional MRI scanner, but the cup-coil can also be operated in a vertical position. The principles of operation of conventional MRI systems are well understood. (see, for example, U.S. Pat. No. 5,363,845 incorporated herein by reference) Generally speaking, a static uniform magnetic field B$_0$ 8 is applied to an object to be imaged to align the object's nuclear spins along the direction of the magnetic field B$_0$. Then so-called gradient coils 7 arranged cylindrically with respect to the static uniform field generate a magnetic field gradient that allows spatial slice selection. An RF coil tuned to the resonance frequency of the nuclei in the slice, upon being driven by a transmit signal, allows for reorientation of the nuclei. The same RF coil, or a special receive coil, subsequently records the relaxation process of the nuclei. The processing of multiple receive signals results in the formation of an image of the particular slice of the anatomical region.

Figure 3:
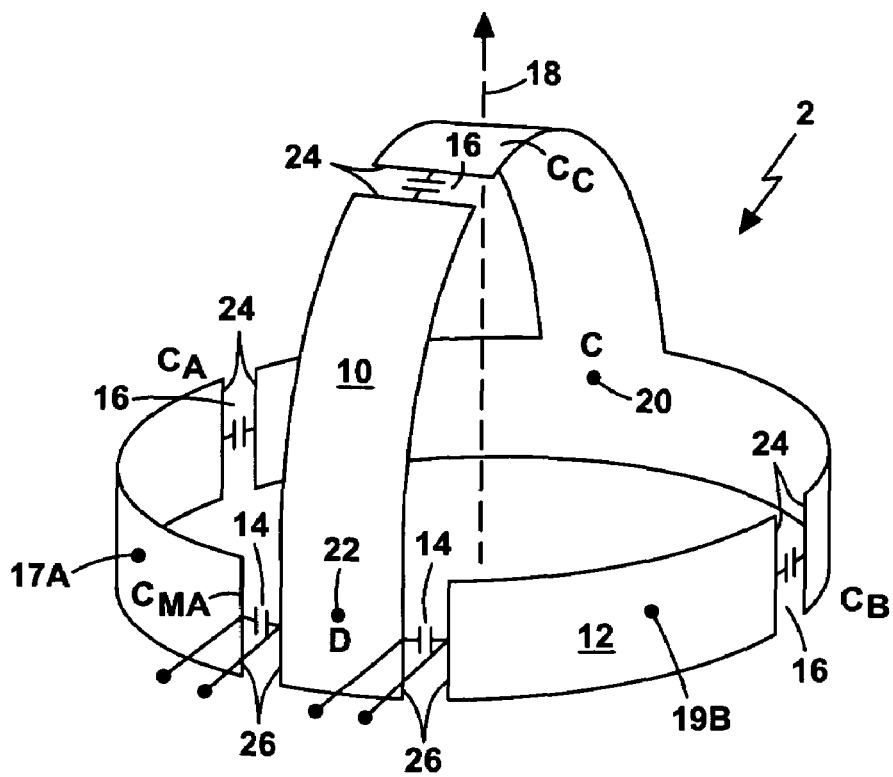
FIG. 3 is an illustration of a single-strap RF cup-coil showing the approximate, relative positioning of electrical components thereof.

FIG. 3 schematically illustrates a single-strap embodiment of a RF cup-coil 2, wherein an arcuate strap 10 is connected to a base ring 12 and passes through an imaginary central axis 18 of the base ring 12. As noted above, the term "arcuate" is meant to encompass non-hemispherical shapes such as, for example, rectangles, ellipses, parabolas, or other shapes. Strap 10 is directly connected to base ring 12 at one end at point C 20, and electrically connected to base ring 12 through tuning capacitors $C_{MA}$, $C_{MB}$ 14 bridging the gaps 26 between its other end (point D 22) and two segments including component points A 17 and B 19, respectively, of base ring 12. The strap 10 and base ring 12 can be implemented with microstrip conductor lines (e.g., copper) or any other conducting material, and are dimensioned so as to receive the anatomical region of interest (e.g., a human breast.) The capacitors $C_A$, $C_B$, $C_C$ 16 and the inherent inductances $L_A$, $A_B$, $L_C$ of the segments of microstrip lines form a resonance system that can be tuned to a particular resonance frequency based on the requirement of the main magnet system of the magnetic resonance (MR) instrument. In order to tune the cup-coil 2 efficiently, fixed and tunable capacitors $C_A$, $C_B$, $C_C$ 16 are deployed at strategically selected cuts 24 in the microstrip segments comprising strap 10 and base ring 12. The selection and adjustment of tuning capacitors $C_{MA}$, $C_{MB}$ 14 is based upon the resonance requirement of the cup-coil at a desired frequency. For instance, the capacitors $C_{MA}$, $C_{MB}$ 14 can be adjusted such that a resonance frequency of 63.87 MHz is achieved, consistent with a 1.5T main magnetic field of a MR system for proton imaging. Other magnetic field strengths can be implemented, such as 3T and higher. Capacitors $C_A$, $C_B$, $C_C$ 16 can be selected and/or adjusted such that their reactances compensate the inherent inductive reactances of the cup coil the cup-coil 2, and such that together with the microstrip inductances $L_A$, $L_B$, $L_C$, the desired resonance frequency is obtained. They also reduce eddy currents that would result as a consequence of the switching gradients of the MR system. The reactance associated with capacitor $C_C$ should be chosen such that it compensates for the inductance associated the inductance $L_C$ of the upper strap. upper strap.

Figure 4C:
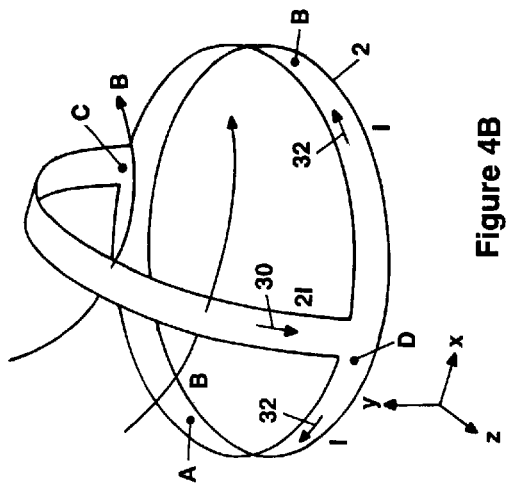
FIG. 4C is an illustration of the combined magnetic field vector BRF produced by the individual magnetic fields associated with Mode$_0$ and Mode$_1$.
Figure 4C:
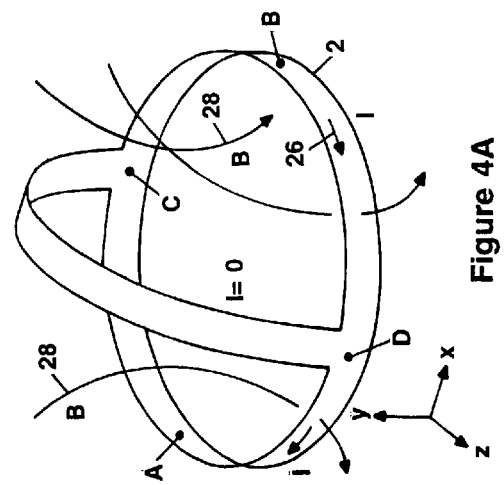
Figure 4C:
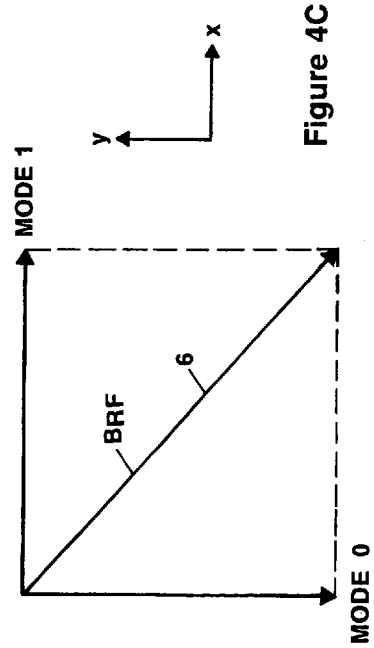

FIGS. 4A and 4B illustrate, respectively, the two modes (Mode$_0$, Mode$_1$) of operation available in the single-strap RF cup-coil 2 and the magnetic fields associated therewith. In Mode$_0$, no current flows through strap 10 while a current I 26 induced in the base ring 12 by the magnetic flux density travels around the annular base ring 12 along current path A-C-B-D. In Mode$_1$, a 90° phase shifted current 2I 30 is induced in the strap 10 and is divided symmetrically into two currents I 32 between two halves of the base ring 12 (or vice versa) along current paths D-A-C and D-B-C respectively. FIGS. 4A and 4B include Cartesian xyz-space axes that help illustrate how the superposition of the modes establishes a rotating magnetic field phasor B$_{RF}$ 6 (shown in FIG. 4C) orthogonal to the uniform static uniform field B$_0$ 8 (shown in FIG. 2) of the MR instrument.

Figure 5:
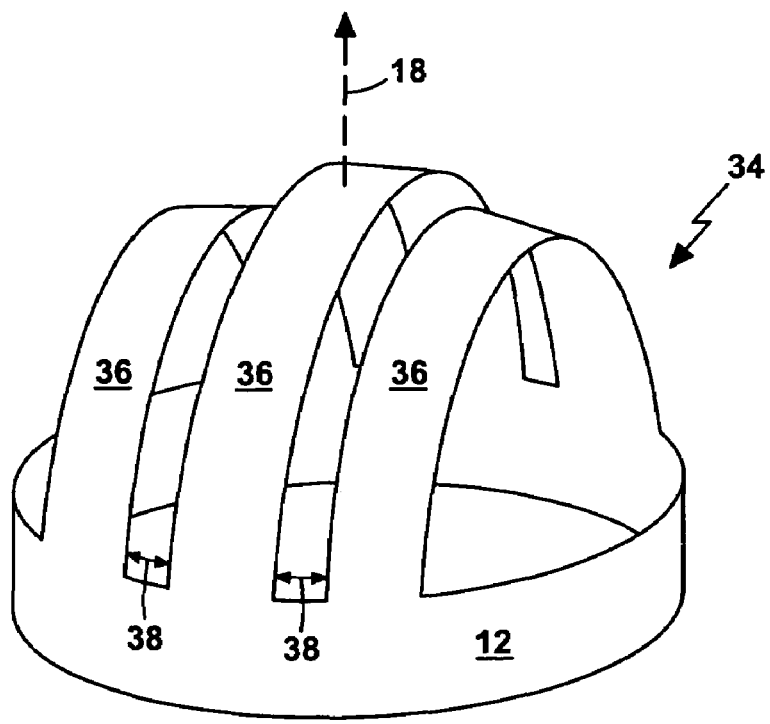
FIG. 5 is an illustration of a three-strap embodiment of the RF cup-coil of the present invention.

In alternative embodiments, multiple straps may be employed for a greater number of operating modes. For example, FIG. 5 illustrates a three-strap, six-port, embodiment 34 of the RF cup-coil that encompasses a higher number than two operating modes, and enables thus more controlled coverage in comparison to the single-strap embodiment. In multi-strap embodiments, each strap 36 is substantially parallel to and spaced-apart from each other's strap by a fixed distance 38, symmetrically disposed with respect to the central axis 18 of the base ring 12. Although not depicted for simplicity, each strap 36 is connected to the base ring conductor 12 as is the strap in the single-strap embodiment, i.e., directly on one end and electrically through a bridging capacitor on the other. Additionally, each strap 36 is comprised of multiple, electrically connected segments of conductors, preferably microstrip lines. The capacitors disposed in the gaps between the conductor segments comprising each strap 36 must similarly be selected to create resonance conditions with the inductance of that strap.

Figure 6A:
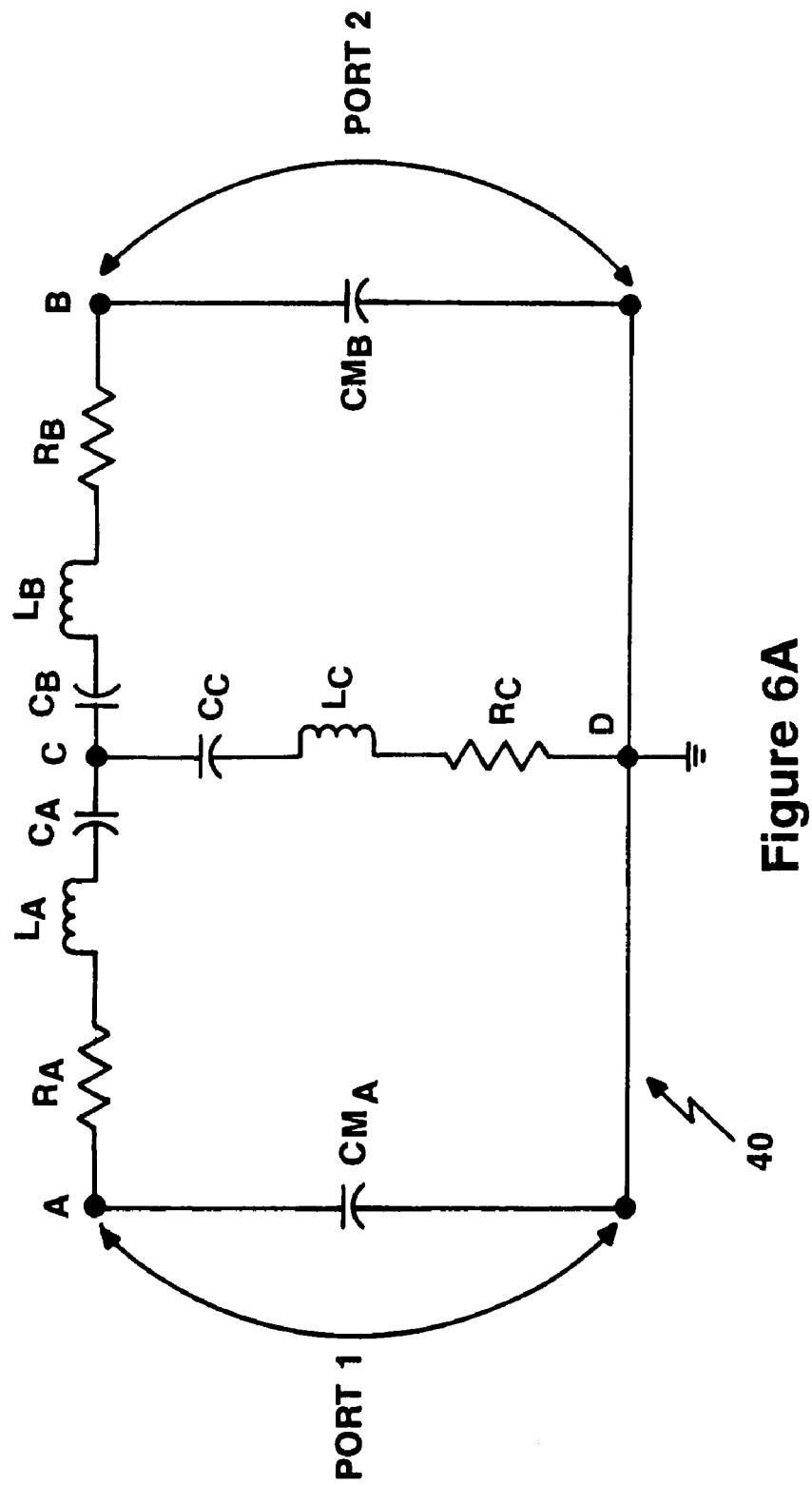
FIG. 6A is a schematic of the equivalent electronic circuit of the single-strap RF cup-coil.
Figure 6B:
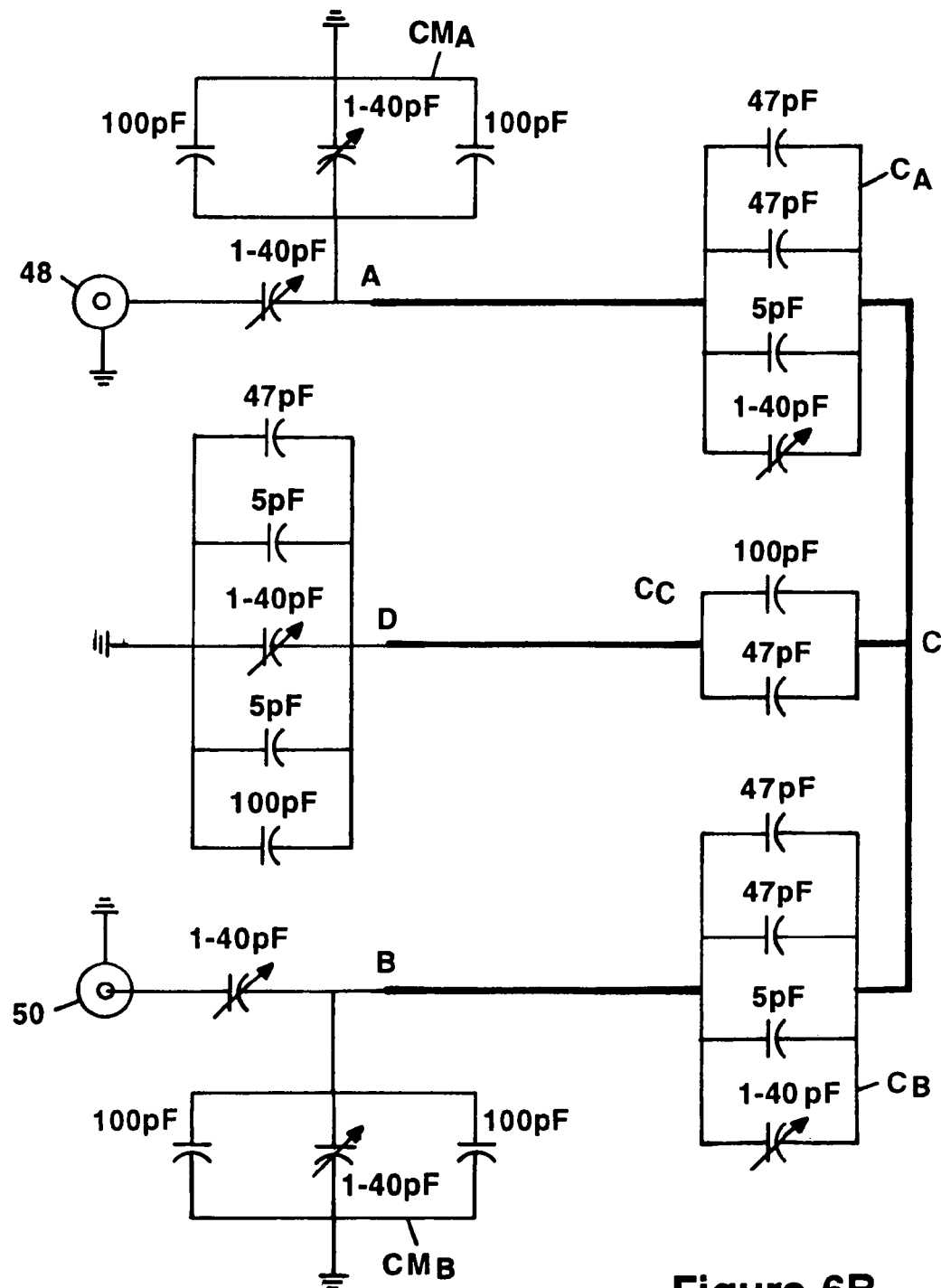
FIG. 6B is a schematic of the equivalent electronic circuit of the single-strap RF cup-coil populated with standard capacitors.

FIG. 6A presents an electronic equivalent circuit 40 of the single-strap RF cup coil 2 depicted in FIG. 3. Nodes A–D in circuit 40 correspond to the identically labeled points in the schematic model of the cup-coil 2 shown in FIG. 3. Electrical losses in the cup-coil 2 are represented in the model circuit by resistors $R_A$, $R_B$ and $R_C$. In circuit 40, capacitors $C_A$, $C_B$, $C_C$ represent the fixed and tunable capacitors 16 described above, inductances $L_A$, $L_B$, $L_C$ represent the inherent inductances of the segments of the microstrip lines, and $C_{MA}$ and $C_{MB}$ represent the tuning capacitors 14 bridging the gaps between the arcuate conductor and two segments of the base ring conductor. The operational and dimensional specifications of a single-strap RF cup-coil implemented using standard fixed and variable capacitors on a dielectric "former" are reflected in FIG. 6B, wherein the reference characters correspond to the tuning capacitors, fixed and tunable capacitors and component points described above, and in Table One and Table Two.

Specifically, the resonance of 63.87 MHz was selected to be compatible with the static field strength of a 1.5T magnetic resonance system for proton imaging. However, by changing the coil geometry and the lumped element capacitor values, other frequencies corresponding to higher field strengths, such as 3 and 4T, can readily be realized. The quality factor, as a division of the magnetic resonance frequency over the 3 dB bandwidth, is recorded for an empty or unloaded coil and can deviate from the listed number by a wide margin depending on losses associated with the deployed capacitors and former materials among other factors. Those skilled in the art will readily appreciate that the details provided are in no sense limiting, as the operational characteristics are easily changed to accommodate the anatomical region of interest to be imaged and/or the resonance frequency desired. For example, the coil diameter has been increased to 250 mm in other implementations of the cup-coil.

TABLE ONE

| Capacitor Value | Manufacturer | Part No. |
|---|---|---|
| 1–40 pF trimmer | Voltronics | NMP40M |
| 10 pF (±5%) | Voltronics | V205 100J |
| 47 pF (±5%) | Voltronics | V205 470J |
| 100 pF (±5%) | Voltronics | V205 200 |

TABLE TWO

| Parameter | Values |
|---|---|
| Coil diameter | 200.0 mm |
| Coil Width (strip width) | 40.0 mm |
| Former outer diameter | 200.0 mm |

TABLE TWO-continued

| Parameter | Values |
|---|---|
| Former inner diameter | 187.3 mm |
| Former material | cast acrylic |
| Former height | 40.0 mm |
| Thickness copper strips | 38 μm |
| Operating frequency | 63.87 Mhz |
| Quality Factor (unloaded Q) | 158.35 |
| 3 dB bandwidth | 0.40 MHz |

Figure 7A:
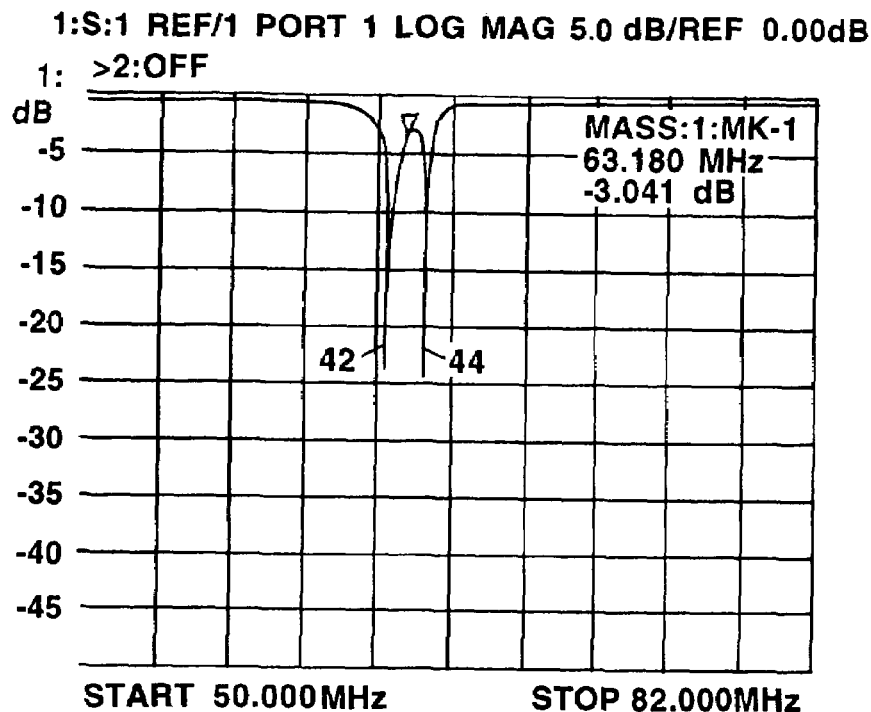
FIG. 7A is a graphical plot of the magnitude of the reflection coefficient versus frequency showing the resonances associated with Mode$_0$ and Mode$_1$ in an untuned state.
Figure 7B:
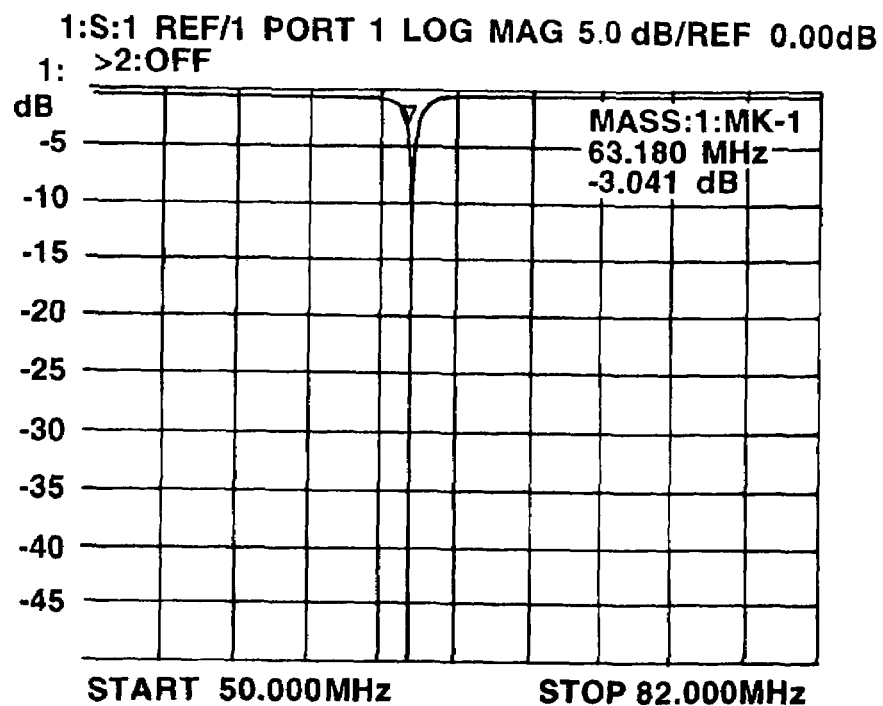
FIG. 7B is a graphical plot of the magnitude of the reflection coefficient versus frequency showing Mode$_0$ and Mode$_1$ combined and tuned to 63.87 MHz.

Additional cup-coil design choices that may optimize the signal-to-noise ratio and homogeneity include the number of straps employed, the length and shape of the strap(s) (alternate shapes, such as, for example more rectangular geometries, are deemed to fall within the definition of the term "arcuate" as used herein), and the dimensions of the base ring. The values of the capacitors in the example were selected based upon the values of the calculated inductances $L_1$, $L_2$, $L_3$ and the desired operating frequency of 63.87 Mhz. The magnitude of the reflection coefficient S11 versus frequency shown in FIG. 7A (recorded with a HP 8345 network analyzer) demonstrates that an untuned single-strap RF coil 2 includes two modes 42, 44. FIG. 7B demonstrates that the cup coil 2 can be tuned and matched to a selected resonance frequency 46. Through appropriate selection of capacitor values $C_A$, $C_B$, $C_C$ 16, different resonance frequencies can be achieved.

Figure 8:
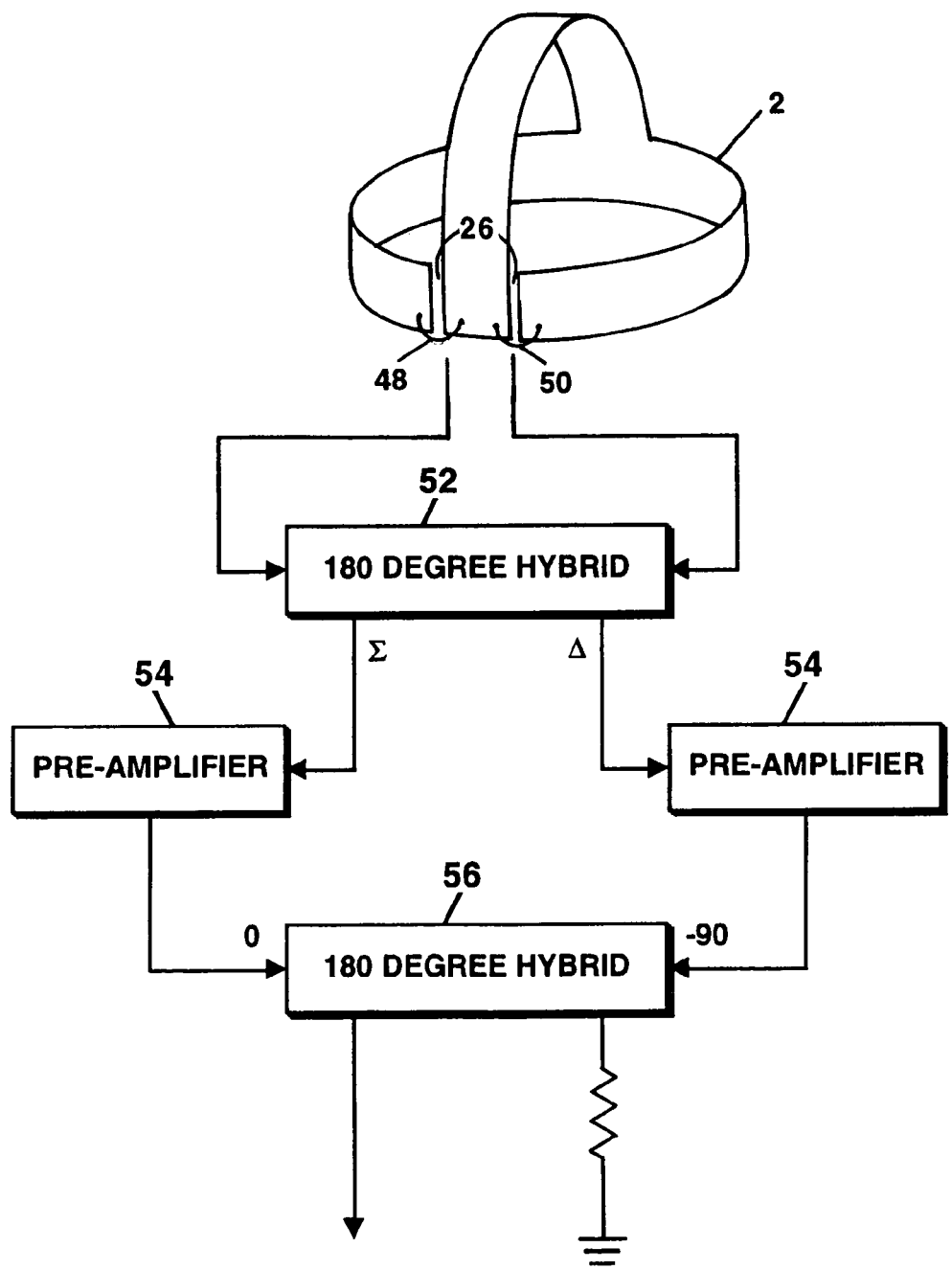
FIG. 8 is a schematic circuit diagram illustrating electrical components utilized in an optional RF coil interface circuit for dual-mode coils.

With reference to FIG. 8, the cup-coil 2 may be interfaced through standard cabling and a single or multi-channel receiver amplifier to existing clinical MR instruments, such as manufactured by GE, SIEMENS, TOSHIBA, and others. The induced receiver current may be picked up by two standard coaxial cables (not shown) at ports 48 and 50 formed at the gaps 26 between strap 10 and base ring 12. Tuning capacitors $C_{MA}$, $C_{MB}$ 14 and one or more matching capacitors match the cup-coil impedance to the desired transmission cable impedance(s) (e.g., 50Ω.) Alternatively, the induced currents picked up at ports 48, 50 can be adapted for a single transmission line interface by combination with a 180° quadrature hybrid 52, two optional pre-amplifiers 52, and a 90° quadrature hybrid 56.

Figure 9:
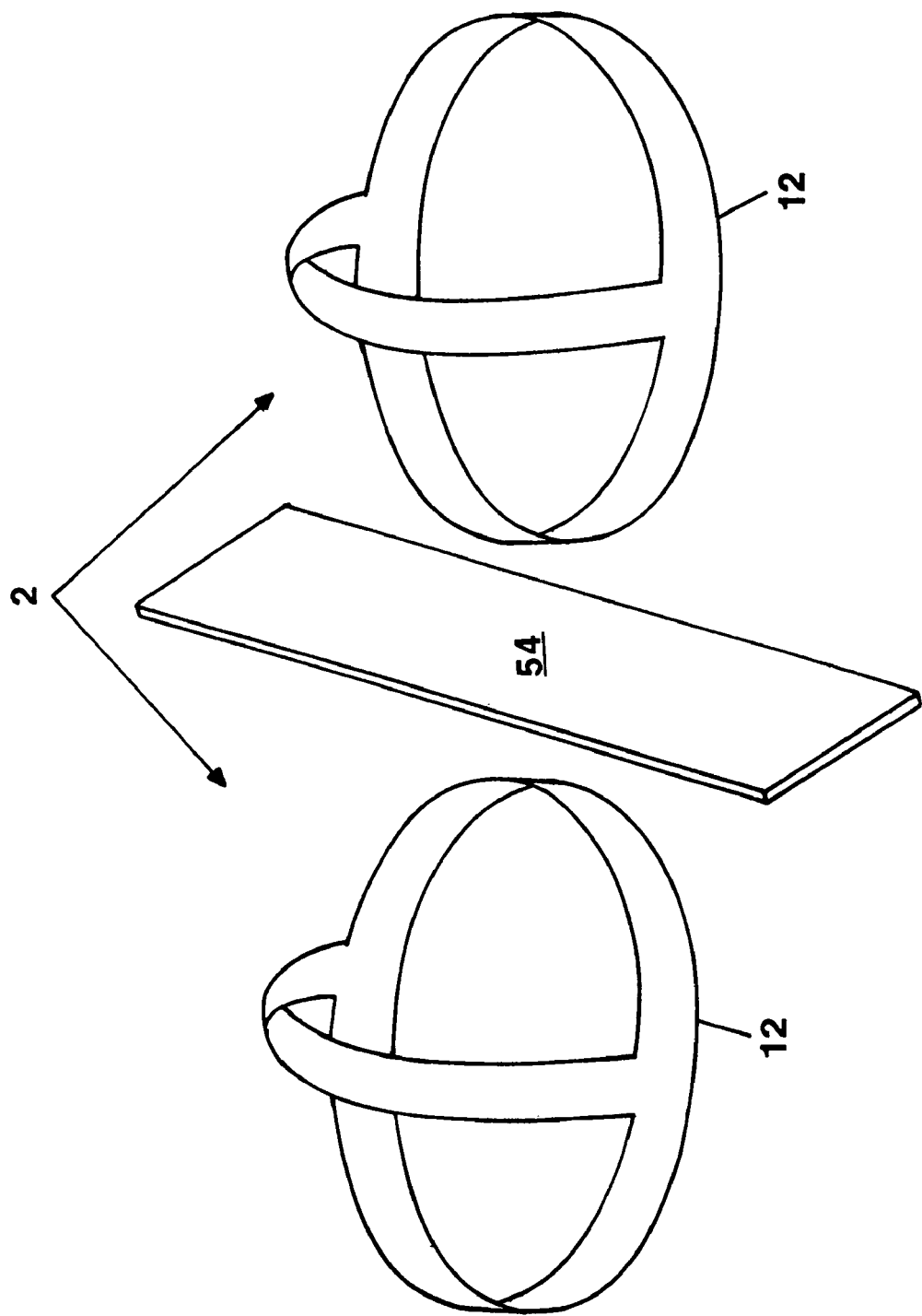
FIG. 9 is an illustration of a dual coil, single-strap RF coil configuration equipped with shielding disposed between the coils.

With reference to FIG. 9, two RF cup-coils 2 may be used and arranged with their respective base rings 12 in order to simultaneously image both breasts of a patient. Mutual electromagnetic interference between the coils 2 may be minimized by positioning segmented conductive foil as shielding 54 between them, or by carefully controlling the operational timing of the coils. Furthermore, interference between conventional RF transmitter coils and the single or dual RF cup-coil 2 can be minimized by employing an active tune, de-tune circuit (not shown.) Specifically, so-called PIN diodes can be connected in shunt with one or multiple capacitors of the cup-shaped coil. These PIN diodes receive a static bias voltage signal such that when biased in reverse direction, a high ohmic state exists at resonance, i.e., the PIN diodes do not affect the operation of the RF cup-coil(s). However, if the static bias voltage signal is applied in forward direction, a low ohmic state exists at resonance, i.e., the PIN diodes provide a low impedance bypass of the associated capacitors, thereby shifting the RF coil's frequency away from the original resonance frequency. As a result, during transmission of RF energy into the biological load, the RF coil will not cause undesired interference.

Additional quadrature hybrid combiners are optionally employed to interface both RF coils to a single-channel receiver amplifier.

Although the invention has been described with respect to various embodiments, it should be realized that this invention is also capable of a wide variety of further and other embodiments within the spirit and scope of the appended claims.

We claim:

1. A multi-modal RF coil capable of being used within an MRI system, comprising:
    a segmented annular base ring conductor having a central axis and including at least one segment configured for direct connection to an arcuate conductor and at least two additional segments;
    a plurality of capacitive electrical connections, at least one of the capacitive electrical connections disposed between each of the segments of the segmented annular base ring conductor; and
    at least one arcuate conductor symmetrically disposed with respect to the central axis of the segmented annular base ring conductor, each arcuate conductor disposed in a corresponding plane orthogonal to the base ring conductor and each at least one arcuate conductor respectively having a first end and a second end terminating at spatially distinct positions along the segmented annular base ring conductor, each first end terminating in direct contact with one of the at least one segment(s) of the segmented annular base ring conductor configured for direct connection to at least one of the arcuate conductors, and each second end of each respective at least one arcuate conductor providing an electrical connection between two of the at least two additional segments of the segmented annular base ring conductor via at least two of the plurality of capacitive electrical connections of the segmented annular base ring conductor;
    wherein the plurality of capacitive electrical connections of the segmented annular base ring conductor comprise fixed or tunable capacitive electrical connections permitting resonance tuning of the multi-modal RF coil.

2. The multi-modal RF coil of claim 1, wherein:
    the at least one arcuate conductor comprises a single arcuate conductor; and
    the multi-modal RF coil being operable in two modes in phase quadrature in order to establish a rotating magnetic field phasor orthogonal to a temporally constant uniform magnetic field generated by the MRI system.

3. The multi-modal RF coil of claim 2, wherein:
    the segmented annular base ring conductor is capable of establishing a first of two modes as a result of current flowing circularly through the annular base ring conductor; and
    a second of two modes is established by a 90° phase shifted current flowing through the at least one arcuate conductor and split between two halves of the segmented annular base ring conductor,
    wherein the multi-modal RF coil is operable in phase quadrature.

4. The multi-modal RF coil of claim 1, wherein:
    the at least one arcuate conductor comprises a plurality of arcuate conductors; and
    the multi-modal RF coil is operable in a plurality of modes in order to establish a rotating magnetic field phasor orthogonal to a temporally constant uniform magnetic field generated by the MRI system.

5. The multi-modal RF coil of claim 1, wherein the at least one arcuate conductor defines a selected cut in an anatomical region that is imaged by the MRI system.

6. The multi-modal RF coil of claim 1, wherein the segmented annular base ring conductor is comprised of a plurality of microstrip line segments.

7. The multi-modal RF coil of claim 1, wherein the at least one of the arcuate conductors is comprised of a plurality of microstrip line segments.

8. The multi-modal RF coil of claim 1, wherein each at least one arcuate conductor further comprises:
    a plurality of conducting segments; and
    at least one tunable capacitive electrical connection disposed in a gap between each of the conducting segments in order to establish resonance with the inherent coil inductance at a target frequency.

9. The multi-modal RF coil of claim 1, wherein at least one reactance associated with the plurality of capacitive electrical connections compensates some or all of the inherent coil inductive reactance at a resonant frequency.

10. The multi-modal RF coil of claim 1, wherein at least one of the plurality of capacitive electrical connections matches an impedance of a corresponding transmission line connecting the multi-modal RF coil to receiving electronics.

11. The multi-modal RF coil of claim 1, wherein the multi-modal RF coil is dimensioned so as to receive a human breast.

12. The multi-modal RF coil of claim 1, further comprising:
    two electrical ports configured for accessing electrical signals induced in the multi-modal RF coil; and
    means for modifying the accessed electrical signals in order to interface with a single or a multi-channel receiver amplifier.

13. A pair of multi-modal RF coils of the type set forth in claim 1, and
    wherein the pair of multi-modal RF coils are disposed in a manner so as to enable imaging of two anatomical regions by the MRI system.

14. The pair of multi-modal RF coils of claim 13, wherein the two anatomical regions comprise a pair of human breasts.

15. The pair of multi-modal RF coils of claim 13, further comprising:
    two pairs of electrical ports, each pair of electrical ports capable of accessing electrical signals induced in one of the multi-modal RF coils.

16. The pair of multi-modal RF coils of claim 15, further comprising means for modifying the accessed electrical signals in order to interface with a single-channel receiver amplifier.

17. The multi-modal RF coil of claim 13, further comprising one or more PIN diodes arranged in shunt with the plurality of capacitive electrical connections, the diodes being switchable between high and low impedance states that are capable of operating at a resonant frequency so as to actively tune, or de-tune, the multi-modal RF coil.

18. An MRI system, including:
    a main magnet component providing a temporally constant and uniform magnetic field;
    at least one gradient coil producing a pulsed, linear field gradient;
    at least one RF coil acting as a transmitter;
    at least one multi-modal RF coil comprising
        a segmented annular base ring conductor having a central axis and including at least one segment configured for direct connection to an arcuate conductor and at least two additional segments;

a plurality of capacitive electrical connections, at least one of the capacitive electrical connections disposed between each of the segments of the segmented annular base ring conductor; and at least one arcuate conductor symmetrically disposed with respect to the central axis of the segmented annular base ring conductor, each arcuate conductor disposed in a corresponding plane orthogonal to the base ring conductor and each at least one arcuate conductor respectively having a first end and a second end terminating at spatially distinct positions along the segmented annular base ring conductor, each first end terminating in direct contact with one of the at least one segment(s) of the segmented annular base ring conductor configured for direct connection to at least one of the arcuate conductors, and each second end of each respective at least one arcuate conductor providing an electrical connection between two of the at least two additional segments of the segmented annular base ring conductor via at least two of the plurality of capacitive electrical connections of the segmented annular base ring conductor;

wherein the plurality of capacitive electrical connections of the segmented annular base ring conductor comprise fixed or tunable capacitive electrical connections permitting resonance tuning of the multi-modal RF coil; and electronics configured for transmitting and receiving electrical signals from the at least one multi-modal RF coil.

* * * * *